US012534802B2

(12) United States Patent
Son et al.

(10) Patent No.: US 12,534,802 B2
(45) Date of Patent: Jan. 27, 2026

(54) SUBSTRATE PROCESSING METHOD

(71) Applicant: JUSUNG ENGINEERING CO., LTD., Gwangju-si (KR)

(72) Inventors: Cheong Son, Gwangju-si (KR); Jae Sung Roh, Gwangju-si (KR); Hong Min Yoon, Gwangju-si (KR); Hong Soo Yoon, Gwangju-si (KR); Youn Joo Jang, Gwangju-si (KR); Ji Hyun Cho, Gwangju-si (KR); Se Whan Jin, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 84 days.

(21) Appl. No.: 18/008,966

(22) PCT Filed: May 17, 2021

(86) PCT No.: PCT/KR2021/006122
§ 371 (c)(1),
(2) Date: Dec. 7, 2022

(87) PCT Pub. No.: WO2021/251636
PCT Pub. Date: Dec. 16, 2021

(65) Prior Publication Data

US 2023/0235457 A1 Jul. 27, 2023

(30) Foreign Application Priority Data

Jun. 8, 2020 (KR) ........................ 10-2020-0068774

(51) Int. Cl.

| | |
|---|---|
| *C23C 16/455* | (2006.01) |
| *C23C 16/44* | (2006.01) |
| *C23C 16/458* | (2006.01) |

(52) U.S. Cl.
CPC .... *C23C 16/45527* (2013.01); *C23C 16/4408* (2013.01); *C23C 16/45548* (2013.01); *C23C 16/4584* (2013.01)

(58) Field of Classification Search
CPC .......... C23C 16/45548; C23C 16/4584; C23C 16/45527
See application file for complete search history.

(56) References Cited

U.S. PATENT DOCUMENTS

2007/0215036 A1 9/2007 Park et al.
2017/0114453 A1 * 4/2017 Chen ..................... C23C 16/045
(Continued)

FOREIGN PATENT DOCUMENTS

CN 105821393 A 8/2016
JP 2010062370 A 3/2010
(Continued)

OTHER PUBLICATIONS

International Search Report for PCT/KR2021/006122 mailed Aug. 25, 2021.

*Primary Examiner* — Tabassom Tadayyon Eslami
(74) *Attorney, Agent, or Firm* — Renaissance IP Law Group LLP

(57) ABSTRACT

The present inventive concept is a substrate processing method in which processing steps are carried out on a substrate supported on a support unit in a processing space that is divided into a first processing area and a second processing area, the substrate processing method comprising: a step in which a first gas and a first purge gas are sprayed in the first processing area; and a step in which a second purge gas and a second gas are sequentially sprayed in the second processing area.

5 Claims, 6 Drawing Sheets

(56) References Cited

U.S. PATENT DOCUMENTS

| | | | |
|---|---|---|---|
| 2018/0057937 | A1 | 3/2018 | Lee et al. |
| 2019/0346300 | A1 | 11/2019 | Kim et al. |

FOREIGN PATENT DOCUMENTS

| | | | | |
|---|---|---|---|---|
| JP | 2018046098 | A | | 3/2018 |
| KR | 20090071004 | | * | 7/2009 |
| KR | 20160001653 | A | | 1/2016 |
| KR | 20200056273 | A | | 5/2020 |

* cited by examiner

SUBSTRATE PROCESSING METHOD

TECHNICAL FIELD

The present disclosure relates to a substrate processing method which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed on a substrate, and examples of the processing process include a deposition process of depositing a thin film including a specific material on the substrate, a photo process of selectively exposing a portion of a thin film by using a photosensitive material, an etching process of removing the selectively exposed portion of the thin film to form a pattern, etc.

Such a processing process on a substrate is performed by a substrate processing apparatus. The substrate processing apparatus includes a chamber which provides a processing space, a supporting unit which supports a substrate, a gas injection unit which injects a gas toward the supporting unit, and an exhaust unit which exhausts a gas from the processing space. The substrate processing apparatus performs a processing process on a substrate by using a source gas and a reactant gas injected by the gas injection unit. The source gas and the reactant gas are exhausted through the exhaust unit. The exhaust unit is configured with a plurality of exhaust lines, and each of the exhaust lines is connected to the chamber. The exhaust unit may separately include an exhaust line for exhausting the source gas and an exhaust line for exhausting the reactant gas.

Here, a source gas unreacted in the processing space should be completely exhausted through the exhaust unit. Such an unreacted source gas includes a material having high reactivity. Therefore, when the unreacted source gas remains in and is accumulated into the exhaust unit, or reacts with a reactant gas exhausted through the exhaust unit and is deposited on the exhaust unit, firing or blockage occurs in the exhaust unit, and due to this, the exhaust performance and stability of the exhaust unit may be reduced.

DISCLOSURE

Technical Problem

The present inventive concept is devised to solve the above-described problem and is for providing a substrate processing method which may prevent the occurrence of a problem where an unreacted source gas remains in and is accumulated into an exhaust unit in a process of exhausting a gas.

Technical Solution

To accomplish the above-described objects, the present inventive concept may include the following elements.

A substrate processing method according to the present inventive concept performs a processing process on a substrate supported by a supporting unit in a processing space divided into a first processing region and a second processing region.

A substrate processing method according to the present inventive concept may include: a step of sequentially injecting a first gas and a first purge gas into the first processing region; and a step of sequentially injecting a second purge gas and a second gas, reacting with the first gas, into the second processing region. When the first gas is injected into the first processing region, the second purge gas may be injected into the second processing region. When the second gas is injected into the second processing region, the first purge gas may be injected into the first processing region.

A substrate processing method according to the present inventive concept may include: a step of injecting a first gas into the first processing region and injecting a second purge gas into the second processing region; and a step of injecting a first purge gas into the first processing region and injecting a second gas, reacting with the first gas, into the second processing region. The steps may be sequentially performed. When the first gas is injected into the first processing region, the second gas may not be injected into the second processing region. When the second gas is injected into the second processing region, the first gas may not be injected into the first processing region.

A substrate processing method according to the present inventive concept may include: a step of injecting a first gas into the first processing region, injecting a second purge gas into the second processing region, and exhausting each of the first gas and the second purge gas; and a step of injecting a first purge gas into the first processing region, injecting a second gas, reacting with the first gas, into the second processing region, and exhausting each of the first purge gas and the second gas. The steps may be sequentially performed. When the first gas is exhausted from the first processing region, the second purge gas may be exhausted from the second processing region. When the second gas is exhausted from the second processing region, the first purge gas may be exhausted from the first processing region.

A substrate processing method according to the present inventive concept may include: a step of injecting a first gas into the first processing region, injecting a second purge gas into the second processing region, and exhausting each of the first gas and the second purge gas; and a step of injecting a first purge gas into the first processing region, injecting a second gas, reacting with the first gas, into the second processing region, and exhausting each of the first purge gas and the second gas. The steps may be sequentially performed. When the first gas is exhausted from the first processing region, the second gas may not be exhausted from the second processing region. When the second gas is exhausted from the second processing region, the first gas may not be exhausted from the first processing region.

A substrate processing method according to the present inventive concept may include a step of injecting a division gas, which is for dividing the first processing region and the second processing region, into a region between the first processing region and the second processing region.

A substrate processing method according to the present inventive concept may include a step of rotating the supporting unit so that the at least one substrate supported by the supporting unit moves between the first processing region and the second processing region.

In a substrate processing method according to the present inventive concept, the step of rotating the supporting unit may be repeatedly performed.

Advantageous Effect

According to the present inventive concept, the following effects may be realized.

The present inventive concept is implemented to prevent an unreacted first gas from being combined with an unreacted second gas in a process of exhausting a gas from a processing space. Accordingly, the present inventive concept may decrease the amount of particles occurring in the process of exhausting the gas from the processing space. Also, the present inventive concept may enhance exhaust performance for exhausting the gas from the processing space and may enhance stability in a process of exhausting a gas.

MODE FOR INVENTION

Hereinafter, an embodiment of a substrate processing apparatus according to the present inventive concept will be described in detail with reference to the accompanying drawings.

Figure 1:
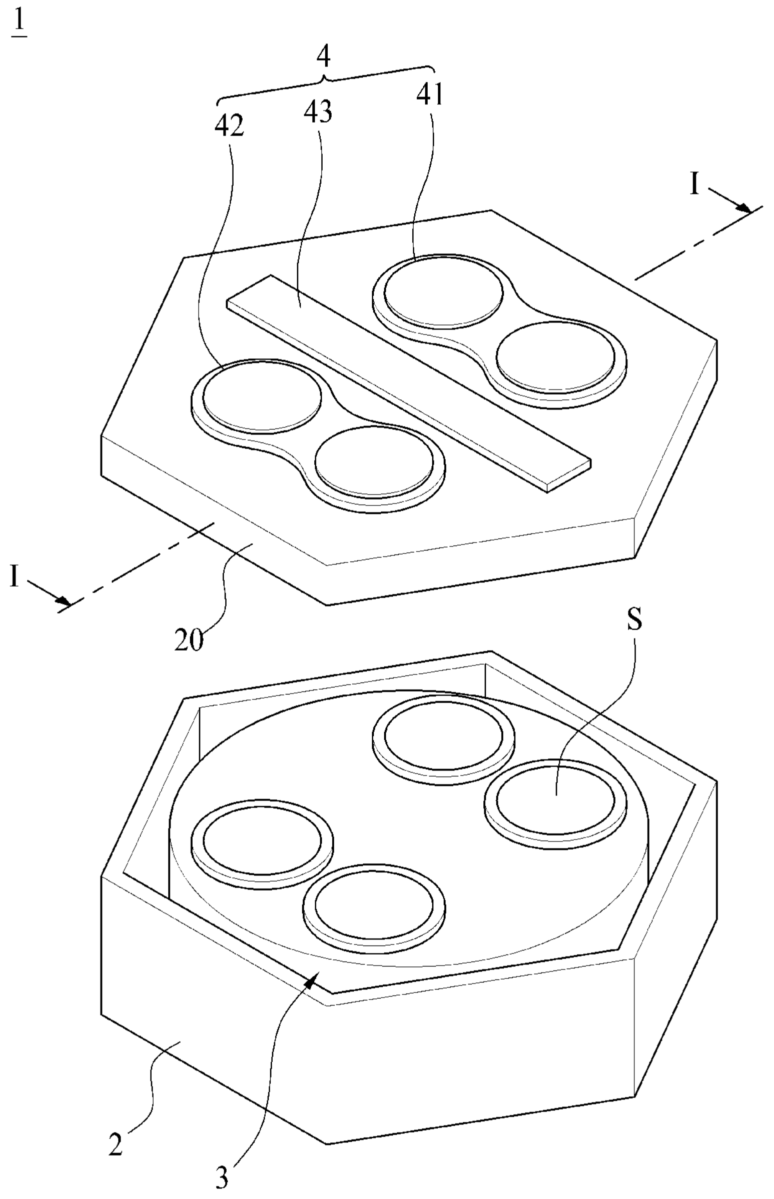
FIG. 1 is a schematic exploded perspective view of a substrate processing apparatus according to the present inventive concept.
Figure 2:
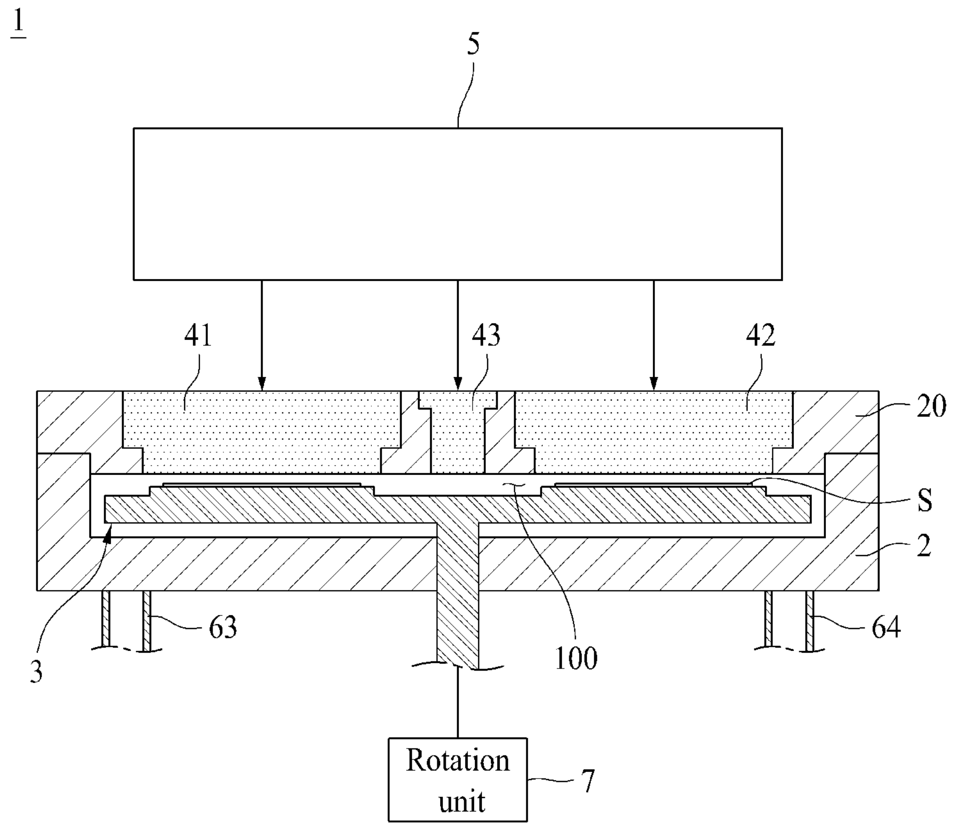
FIG. 2 is a schematic side cross-sectional view of a substrate processing apparatus according to the present inventive concept with respect to line I-I of FIG. 1.

Referring to FIGS. 1 and 2, a substrate processing apparatus 1 according to the present inventive concept performs a processing process on a substrate S. The substrate S may be a glass substrate, a silicon substrate, a metal substrate, or the like. The substrate processing apparatus 1 according to the present inventive concept may perform a processing process such as a deposition process of depositing a thin film on the substrate S and an etching process of removing a portion of the thin film deposited on the substrate S. Hereinafter, an embodiment where the substrate processing apparatus 1 according to the present inventive concept performs the processing process will be mainly described, but it is obvious to those skilled in the art that an embodiment, where the substrate processing apparatus 1 according to the present inventive concept performs another processing process like the etching process, is deduced based thereon.

The substrate processing apparatus 1 according to the present inventive concept may include a chamber 2, a supporting unit 3, a gas injection unit 4, a gas supply unit 5, and an exhaust unit 6.

Chamber

Figure 3:
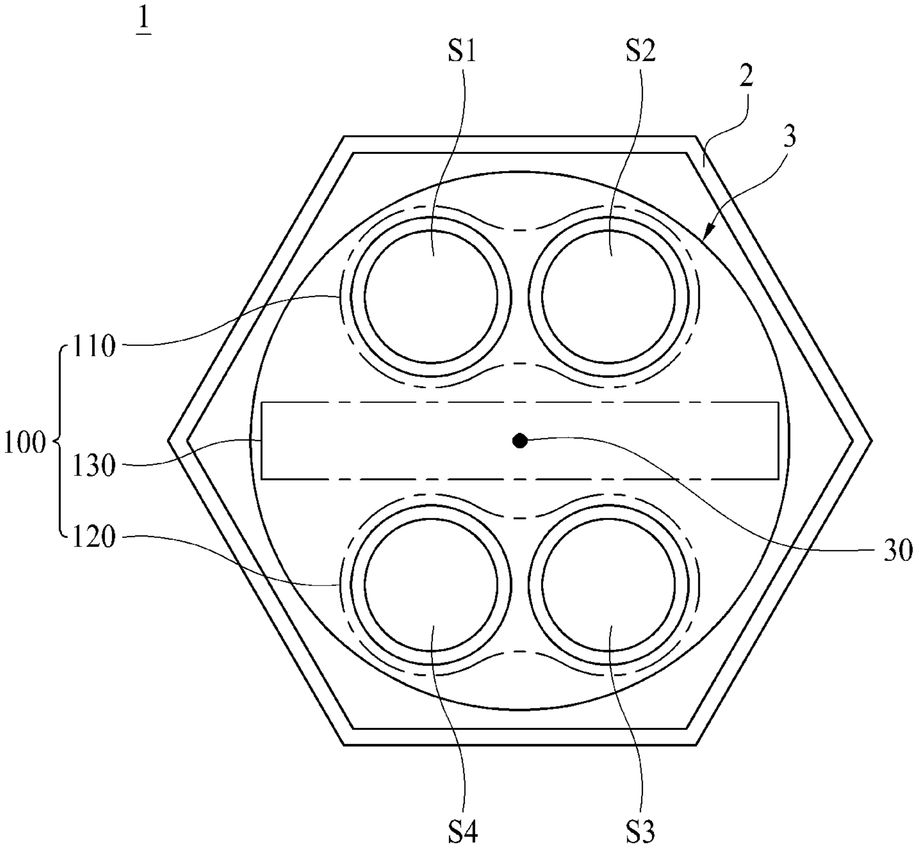
FIG. 3 is a schematic plan view of a supporting unit in a substrate processing apparatus according to the present inventive concept.
Figure 4:
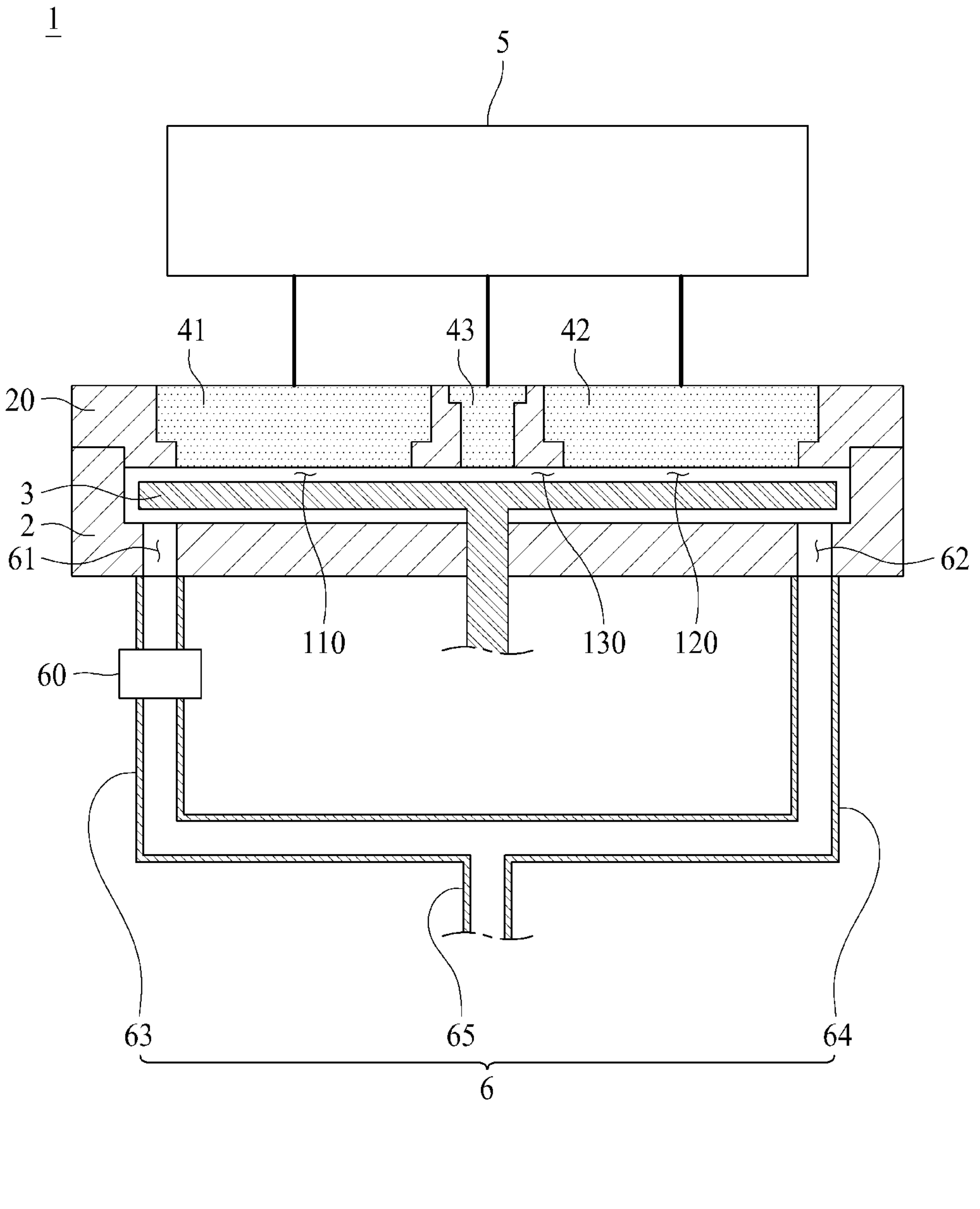
FIG. 4 is a schematic side cross-sectional view taken along line I-I of FIG. 1 in a substrate processing apparatus according to the present inventive concept, for describing an exhaust unit.

Referring to FIGS. 1 to 3, the chamber 2 provides a processing space 100. In the processing space 100, a processing process such as a deposition process or an etching process may be performed on the substrate S. The processing space 100 may include a first processing region 110, a second processing region 120, and a third processing region 130 between the first processing region 110 and the second processing region 120, in the chamber 2. The supporting unit 3 and the gas injection unit 4 may be installed in the chamber 2.

Supporting Unit

Referring to FIGS. 1 to 3, the supporting unit 3 may be disposed in the chamber 2. The supporting unit 3 may support one substrate S, or may support a plurality of substrates S1 to S3 (illustrated in FIG. 3). In a case where the processing space 100 includes the first processing region 110, the second processing region 120, and the third processing region 130, a portion of the supporting unit 3 may be disposed in the first processing region 110, another portion of the supporting unit 3 may be disposed in the second processing region 120, and another portion of the supporting unit 3 may be disposed in the third processing region 130. In a case where the plurality of substrates S1 to S3 are supported by the supporting unit 3, some of the plurality of substrates S1 to S3 may be disposed in the first processing region 110, and the other substrates may be supported by the supporting unit 3 so as to be disposed in the second processing region 120.

The supporting unit 3 may rotate with respect to a supporting shaft 30 (illustrated in FIG. 3) of the supporting unit 3 in the chamber 2. Based on a rotation of the supporting unit 3, the substrates S supported by the supporting unit 3 may respectively move to different processing regions in the chamber 2. When the supporting unit 3 rotates, some of the plurality of substrates S1 to S3 may move from the first processing region 110 to the second processing region 120 via the third processing region 130 and may again move from the second processing region 120 to the first processing region 110 via the third processing region 130. A rotation of the supporting unit 3 may be repeatedly stopped and performed, or may be continuously performed without stopping. Accordingly, the substrates S supported by the supporting unit 3 may respectively move to the different processing regions by repeatedly performing a stop operation and a movement operation, or may continuously move without stopping.

Gas Injection Unit

Referring to FIGS. 1 to 3, the gas injection unit 4 injects a gas toward the supporting unit 3. The gas injection unit 4 may be connected to the gas supply unit 5. Therefore, the gas injection unit 4 may inject a gas, supplied from the gas supply unit 5, toward the supporting unit 3. The gas injection unit 4 may be disposed to be opposite to the substrate supporting unit 3. The processing space 100 may be disposed between the gas injection unit 4 and the supporting unit 3. The gas injection unit 4 may be coupled to a chamber lid 20. The chamber lid 20 is coupled to the chamber 2 to cover an upper portion of the chamber 2.

The gas injection unit 4 may include a first injection unit 41 and a second injection unit 42.

The first injection unit 41 injects a gas into the first processing region 110. The first processing region 110 may correspond to a portion of the processing space 100. The first injection unit 41 may be disposed upward apart from the supporting unit 3. In this case, the first processing region 110 may be a region between the first injection unit 41 and the supporting unit 3. The first injection unit 41 may inject a first gas G1 and a first purge gas PG1 into the first processing region 110. The first gas G1 may be a source gas. The first purge gas PG1 may be an inert gas such as argon (Ar).

Therefore, a processing process using the first gas G1 may be performed on a substrate S disposed in the first processing region 110. In a case where the first gas G1 is a source gas which reacts with a reactant gas to deposit a thin film, the processing process may be a process of adsorbing the source gas onto a surface of the substrate S. Also, the first purge gas PG1 may purge the first gas G1, which is not adsorbed onto the substrate S, in the first processing region 110. In a case where some substrates S1 and S2 of the plurality of substrates S1 to S3 supported by the supporting unit 3 are disposed in the first processing region 110, the first gas G1 and the first purge gas PG1 injected from the first injection unit 41 may be sequentially injected on the substrates S1 and S2.

The second injection unit 42 injects a gas into the second processing region 120. The second processing region 120 may correspond to a portion of the processing space 100. The second injection unit 42 may be disposed upward apart from the supporting unit 3. In this case, the second processing region 120 may be a region between the second injection unit 42 and the supporting unit 3.

The second injection unit 42 may inject a second gas G2 and a second purge gas PG2 into the second processing region 120. The second gas G2 may be a source gas, and in this case, the first gas G1 may be a reactant gas. The second purge gas PG2 may be an inert gas such as argon (Ar). The second injection unit 42 may be connected to the gas supply unit 5.

Therefore, a processing process using the second gas G2 may be performed on a substrate S disposed in the second processing region 120. In a case where the second gas G2 reacts with the first gas G1 to form a thin film, the processing process may be a process of reacting the first gas G1 and the second gas G2 adsorbed onto the substrate S to form a thin film on a surface of the substrate S. Also, the second purge gas PG2 may additionally purge the first gas G1, remaining in the surface of the substrate S, in the second processing region 120, or may purge the second gas G2 which does not react with the first gas G1. In a case where some substrates S1 and S2 of a plurality of substrates S1 to S4 supported by the supporting unit 3 are disposed in the first processing region 110, some other substrates S3 and S4 may be disposed in the second processing region 120. The second gas G2 and the second purge gas PG2 injected from the second injection unit 42 may be injected on the some other substrates S3 and S4. The second injection unit 42 may sequentially inject the second purge gas PG2 and the second gas G2.

The gas injection unit 4 may further include a third injection unit 43.

The third injection unit 43 injects a gas into the third processing region 130. The third processing region 130 may correspond to a portion of the processing space 100. The third processing region 130 may be a region between the first processing region 110 and the second processing region 120. The third injection unit 43 may be disposed upward apart from the supporting unit 3. The third injection unit 43 may be disposed between the first injection unit 41 and the second injection unit 42.

The third injection unit 43 may inject a division gas into the third processing region 130. The division gas may be an inert gas such as argon (Ar). As the third injection unit 43 injects the division gas into the third processing region 130, the first processing region 110 and the second processing region 120 may be spatially separate from each other so that a gas is not mixed therebetween. The third injection unit 43 may be connected to the gas supply unit 5. In a case where some substrates S1 and S2 of a plurality of substrates S1 to S4 supported by the supporting unit 3 are disposed in the first processing region 110 and some other substrates S3 and S4 may be disposed in the second processing region 120, the third injection unit 43 may inject the division gas into a space between the substrates S1 and S2 disposed in the first processing region 110 and the substrates S3 and S4 disposed in the second processing region 120.

Gas Supply Unit

Referring to FIGS. 1 to 3, the gas supply unit 5 supplies a gas to the gas injection unit 4. The gas supply unit 5 may supply the gas injection unit 4 with the first gas G1, the first purge gas PG1, the second gas G2, and the second purge gas PG2. In a case where the gas injection unit 4 injects the division gas, the gas supply unit 5 may additionally supply the division gas to the gas injection unit 4. In this case, the gas supply unit 5 may intermittently or continuously supply the division gas to the third injection unit 43 while a processing process is being performed on the substrate S.

Exhaust Unit

Referring to FIGS. 1 to 4, the exhaust unit 6 exhausts a gas from the processing space 100. The exhaust unit 6 may be coupled to the chamber 2 to communicate with an inner portion of the chamber 2.

The exhaust unit 6 may include a first exhaust port 61, a second exhaust port 62, a first exhaust member 63, a second exhaust member 64, and an integration member 65.

The first exhaust port 61 and the second exhaust port 62 may be formed as a plurality of exhaust ports in the chamber 2. The first exhaust port 61 may be formed in the chamber 2 so as to exhaust the first processing region 110. The second exhaust port 62 may be formed in the chamber 2 so as to exhaust the second processing region 120.

The first exhaust member 63 may be provided for exhausting the first processing region 110 through the first exhaust port 61. A gas injected into the first processing region 110 may be exhausted to the outside of the chamber 2 through the first exhaust port 61 and the first exhaust member 63. One side of the first exhaust member 63 may be coupled to the first exhaust port 61 formed in the chamber 2, and the other side thereof may be coupled to the integration member 65.

The second exhaust member 64 may be provided for exhausting the second processing region 120 through the second exhaust port 62. A gas injected into the second processing region 120 may be exhausted to the outside of the chamber 2 through the second exhaust port 62 and the second exhaust member 64. One side of the second exhaust member 64 may be coupled to the second exhaust port 62 formed in the chamber 2, and the other side thereof may be coupled to the integration member 65.

The integration member 65 is connected to each of the first exhaust member 63 and the second exhaust member 64. A gas exhausted through the first exhaust member 63 and a gas exhausted through the second exhaust member 64 may be combined in the integration member 65 and may be exhausted. Each of the integration member 65, the second exhaust member 64, and the first exhaust member 63 may be implemented with a hose, a pipe, or the like.

In a case where the first gas G1 is injected into the first processing region 110 and the second gas G2 is injected into the second processing region 120, an unreacted gas of the first gas G1 may be exhausted from the chamber 2 through the first exhaust member 63, and an unreacted gas of the second gas G2 may be exhausted from the chamber 2 through the second exhaust member 64.

Here, in a case where the first gas G1 is exhausted from the first exhaust member 63 and the second gas G2 is exhausted from the second exhaust member 64, the first gas G1 and the second gas G2 may be combined and react with each other in the integration member 65. A reaction between the first gas G1 and the second gas G2 occurring in an exhaust process may be an undesired reaction and may be an unstable reaction. As a resultant material of the reaction is accumulated into the integration member 65 and an exhaust line subsequent thereto, an exhaust space may be narrowed to decrease exhaust performance, and a risk such as firing may occur in an operation of replacing an exhaust line, causing a problem where the stability of equipment management and maintenance is reduced.

In order to solve such problems, the substrate processing apparatus 1 according to the present inventive concept may be implemented as follows.

Referring to FIGS. 1 to 6, when the first injection unit 41 supplies the first gas G1 to a substrate S supported by a supporting unit 3 of the first processing region 110, the second injection unit 42 may supply the second purge gas PG2 to a substrate S supported by a supporting unit 3 of the second processing region 120.

Therefore, an adsorption process using the first gas G1 may be performed in the first processing region 110, and a purge process of purging a surface of a substrate S disposed in the second processing region 120 may be performed by using the second purge gas PG2 in the second processing region 120. The first gas G1 may be exhausted through the first exhaust port 61 and the first exhaust member 63 formed in a lower space of the chamber 2 corresponding to the first processing region 110. The second purge gas PG2 may be exhausted through the second exhaust port 62 and the second exhaust member 64 formed in a lower space of the chamber 2 corresponding to the second processing region 120. At this time, as the second gas G2 is not injected into the processing space 100 of the chamber 2, the second gas G2 may not flow into the first exhaust member 63 and the second exhaust member 64, or the amount of second gas G2 flowing into the first exhaust member 63 and the second exhaust member 64 may be reduced.

The first exhaust member 63 may include a decomposition mechanism 60 (illustrated in FIG. 4) which decomposes the first gas G1 to decrease reactivity. For example, the first gas G1 including an amine group having high reactivity may be decomposed while passing through the decomposition mechanism 60, or the amine group thereof may be removed, whereby reactivity on the second gas G2 may be reduced.

The first gas G1 and the second purge gas PG2 passing through the first exhaust member 63 and the second exhaust member 64 may be combined in the integration member 65 and may be exhausted through an exhaust pump (not shown) via a collection mechanism (not shown).

The first gas G1 unreacted in the first processing region 110 may be exhausted through an exhaust process without reacting despite contacting the second gas G2.

Therefore, the substrate processing apparatus 1 according to the present inventive concept may decrease the amount of particles occurring in the integration member 65, and moreover, may enhance stability.

Referring to FIGS. 1 to 6, when the second injection unit 42 supplies the second gas G2 to a substrate S supported by a supporting unit 3 of the second processing region 120, the first injection unit 41 may supply the first purge gas PG1 to the substrate S supported by the supporting unit 3 of the first processing region 110.

Therefore, a process of purging the first gas G1 by using the first purge gas PG1 may be performed in the first processing region 110, and a reaction process using the second gas G2 may be performed in the second processing region 120. In this case, when there is the first gas G1 which is adsorbed on the surface of the substrate S disposed in the second processing region 120, the second gas G2 may react with the adsorbed first gas G1 to form a thin film on the surface of the substrate S.

The first purge gas PG1 may be exhausted through the first exhaust port 61 and the first exhaust member 63 formed in the lower space of the chamber 2 corresponding to the first processing region 110. The second gas G2 may be exhausted through the second exhaust port 62 and the second exhaust member 64 formed in the lower space of the chamber 2 corresponding to the second processing region 120. At this time, as the first gas G1 is not injected into the processing space 100 of the chamber 2, the first gas G1 may not flow into the first exhaust member 63 and the second exhaust member 64, or the amount of second gas G2 flowing into the first exhaust member 63 and the second exhaust member 64 may be reduced.

The first purge gas PG1 passing through the first exhaust member 63 and the second exhaust member 64 may be combined in the integration member 65 and may be exhausted through the exhaust pump via the collection mechanism.

The second gas G2 unreacted in the first processing region 110 may be exhausted through the exhaust process without reacting despite contacting the first gas G1.

Therefore, the substrate processing apparatus 1 according to the present inventive concept may decrease the amount of particles occurring in the integration member 65, and moreover, may enhance stability.

Referring to FIGS. 1 to 6, the substrate processing apparatus 1 according to the present inventive concept may further include a rotation unit 7.

The rotation unit 7 rotates the supporting unit 3. The rotation unit 7 may rotate the supporting unit 3 with respect to the supporting shaft 30. The rotation unit 7 may rotate the supporting unit 3 so that at least one substrate S supported by the supporting unit 3 moves between the first processing region 110 and the second processing region 120. Based on a rotation of the supporting unit 3, the at least one substrate S supported by the supporting unit 3 may sequentially pass through the first processing region 110, the third processing region 130, the second processing region 120, and the third processing region 130. The rotation of the supporting unit 3 may be intermittently performed, and speed adjustment may be performed thereon. When the at least one substrate S supported by the supporting unit 3 is disposed in the first processing region 110 and the first gas G1 or the first purge gas PG1 is injected into the first processing region 110, the supporting unit 3 may stop or may decrease in rotation speed thereof. Also, when the at least one substrate S may be disposed in the second processing region 120 and the second purge gas PG2 or the second gas G2 is injected from the second processing region 120, the supporting unit 3 may stop or may decrease in rotation speed thereof. The rotation of the supporting unit 3 may not stop when the at least one substrate S supported by the supporting unit 3 is passing through the third processing region 130.

Moreover, the substrate processing apparatus 1 according to the present inventive concept may be implemented to perform a processing process in a state where at least one substrate S is disposed in only one region of the first processing region 110 and the second processing region 120. This will be described below in detail.

Figure 5:
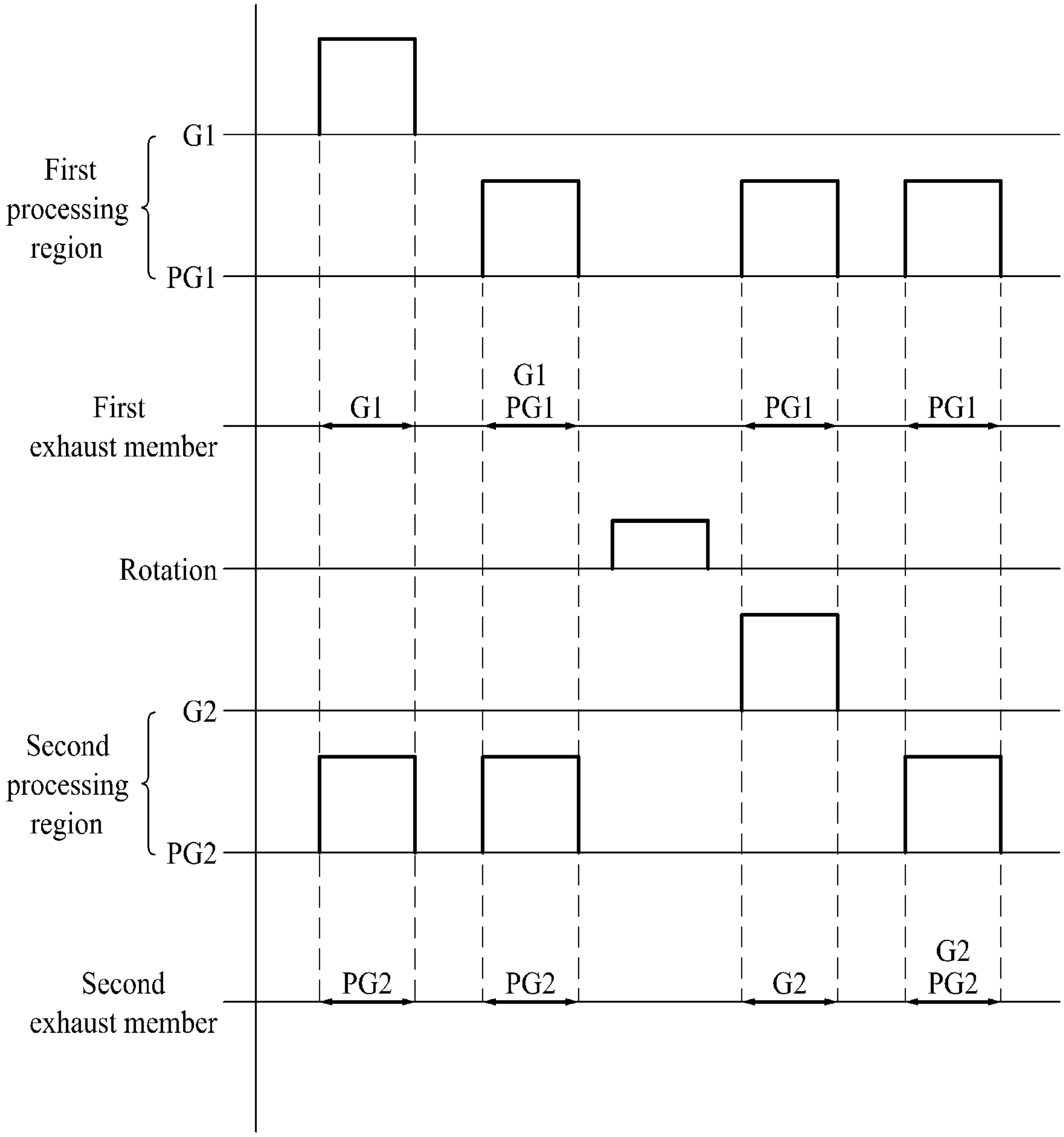
FIGS. 5 and 6 are timing diagrams illustrating a period where a substrate processing apparatus according to the present inventive concept injects each of a first gas, a first purge gas, a second gas, and a second purge gas and a period where the substrate processing apparatus according to the present inventive concept does not inject each of the first gas, the first purge gas, the second gas, and the second purge gas.

First, when at least one substrate S is disposed in the first processing region 110 as the rotation unit 7 stops the rotation of the supporting unit 3, as illustrated in FIG. 5, the first gas G1 may be injected into the first processing region 110, and thus, the adsorption process may be performed. At this time, the second purge gas PG2 may be injected into the second processing region 120. Accordingly, the first gas G1 and the second purge gas PG2 may be exhausted to the exhaust unit 6.

Subsequently, after the injection of the first gas G1 into the first processing region 110 stops, the first purge gas PG1 may be injected into the first processing region 110. Therefore, the first gas G1 may be purged from the first processing region 110. At this time, the second purge gas PG2 may be injected into the second processing region 120. Therefore, the first purge gas PG1 and the second purge gas PG2 may be exhausted to the exhaust unit 6. In FIG. 5, it is illustrated that the injection of the second purge gas PG2 into the second processing region 120 stops while the injection of the first gas G1 into the first processing region 110 stops, but the present inventive concept is not limited thereto and the second purge gas PG2 may be continuously injected into the second processing region 120 while the first gas G1 and the first purge gas PG1 are sequentially injected from the first processing region 110.

Subsequently, after the sequential injection of the first gas G1 and the first purge gas PG1 into the first processing region 110 and the injection of the second purge gas PG2 into the second processing region 120 stop, the rotation unit 7 may rotate the supporting unit 3. Therefore, at least one substrate S disposed in the first processing region 110 may move from the first processing region 110 to the second processing region 120 via the third processing region 130. When at least one substrate S is disposed in the second processing region 120 as the rotation unit 7 stops the rotation of the supporting unit 3, as illustrated in FIG. 5, the deposition process may be performed by injecting the second gas G2 into the second processing region 120. At this time, the first purge gas PG1 may be injected into the first processing region 110. Accordingly, the second gas G2 and the first purge gas PG1 may be exhausted to the exhaust unit 6.

Subsequently, after the injection of the second gas G2 into the second processing region 120 stops, the second purge gas PG2 may be injected into the second processing region 120. Therefore, the second gas G2 may be purged from the second processing region 120. At this time, the first purge gas PG1 may be injected into the first processing region 110. Therefore, the second purge gas PG2 and the first purge gas PG1 may be exhausted to the exhaust unit 6. In FIG. 5, it is illustrated that the injection of the first purge gas PG1 into the first processing region 110 stops while the injection of the second gas G2 into the second processing region 120 stops, but the present inventive concept is not limited thereto and the first purge gas PG1 may be continuously injected into the first processing region 110 while the second gas G2 and the second purge gas PG2 are sequentially injected from the second processing region 120.

Subsequently, after the sequential injection of the second gas G2 and the second purge gas PG2 into the second processing region 120 and the injection of the first purge gas PG1 into the first processing region 110 stop, the rotation unit 7 may rotate the supporting unit 3. Therefore, at least one substrate S disposed in the second processing region 120 may move from the second processing region 120 to the first processing region 110 via the third processing region 130.

Figure 6:
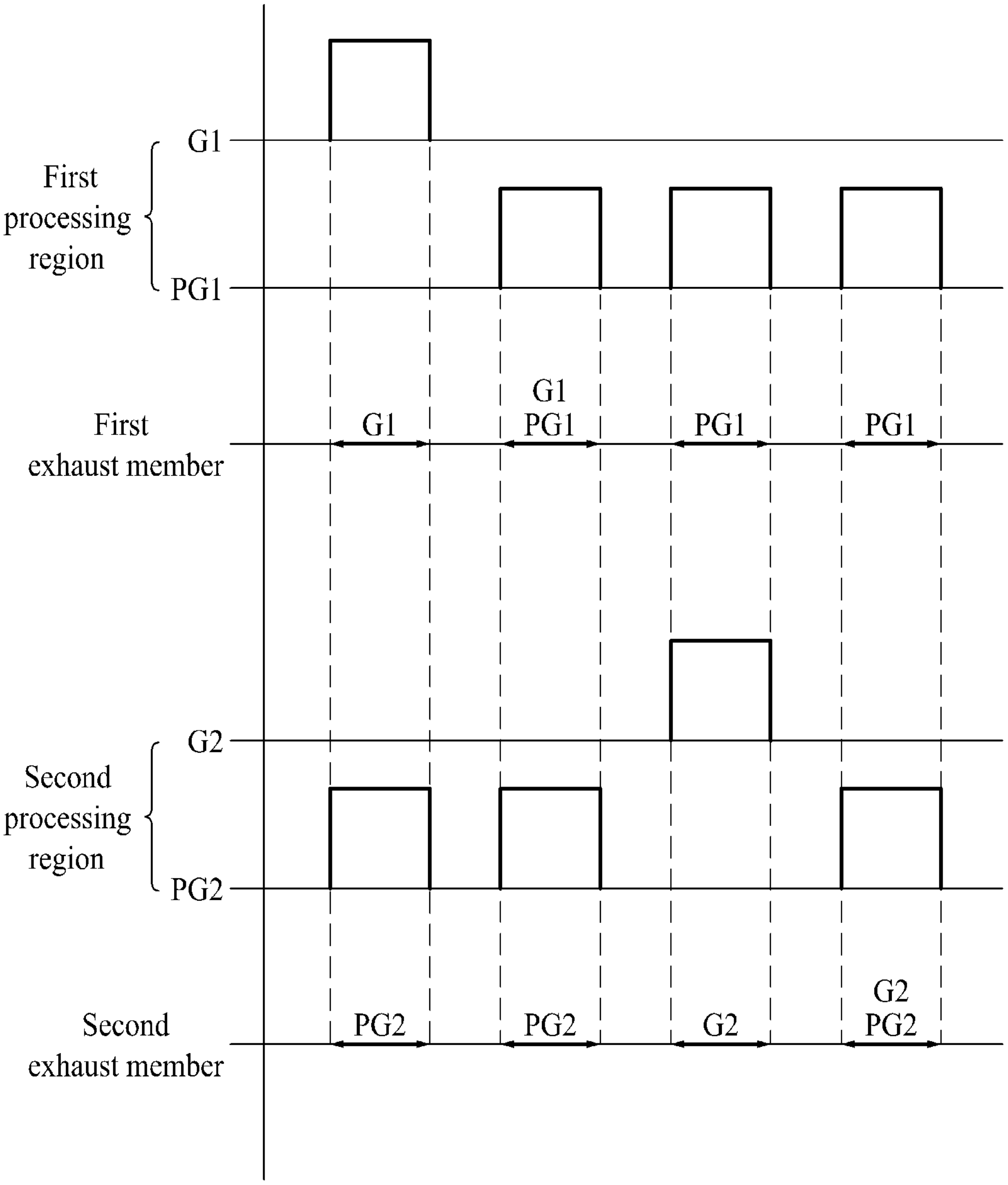

By repeating the above-described process, the substrate processing apparatus 1 according to the present inventive concept may perform a processing process on at least one substrate S. Hereinabove, an embodiment has been described where a processing process is performed in a state where at least one substrate S is disposed in only one region of the first processing region 110 and the second processing region 120, but the substrate processing apparatus 1 according to the present inventive concept may be implemented to perform a processing process in a state where at least one substrate S is disposed in the first processing region 110 and at least one substrate S is disposed in the second processing region 120. In this case, as illustrated in FIG. 6, the second purge gas PG2, the second purge gas PG2, the second gas G2, and the second purge gas PG2 may be sequentially injected from the second processing region 120 while the first gas G1, the first purge gas PG1, the first purge gas PG1, and the first purge gas PG1 are sequentially injected from the first processing region 110, and then, the rotation unit 7 may rotate the supporting unit 3.

Hereinafter, an embodiment of a substrate processing method according to the present inventive concept will be described in detail with reference to the accompanying drawings.

Referring to FIGS. 1 to 6, a substrate processing method according to the present inventive concept performs a processing process on the substrate S. The substrate processing method according to the present inventive concept may perform a deposition process on the substrate S and an etching process on the substrate S. Hereinafter, an embodiment where the substrate processing method according to the present inventive concept performs the deposition process will be mainly described, but it is obvious to those skilled in the art that an embodiment, where the substrate processing method according to the present inventive concept performs another processing process such as the etching process, is deduced based thereon. The substrate processing method according to the present inventive concept may be performed by the substrate processing apparatus 1 according to the present inventive concept.

The substrate processing method according to the present inventive concept may perform a processing process on the substrate S in the processing space 100 which is divided into the first processing region 110 and the second processing region 120. The substrate processing method according to the present inventive concept may include the following steps.

First, a gas may be injected into the first processing region 110. Such a step may be performed by injecting a gas into the first processing region 110 by using the first injection unit 41. A step of injecting the gas into the first processing region 110 may include a step of sequentially injecting a first gas and a first purge gas into the first processing region. As the first gas G1 is injected into the first processing region 110, an adsorption process using the first gas G1 may be performed on at least one substrate S disposed in the first processing region 110. As the first purge gas PG1 is injected into the first processing region 110, the first gas G1 which is not adsorbed onto the substrate S may be purged from the first processing region 110.

Subsequently, when the first gas G1 is injected into the first processing region 110, the second purge gas PG2 may be injected into the second processing region 120. Such a step may be performed by injecting the second purge gas PG2 into the second processing region 120 by using the second injection unit 42 when the first injection unit 41 injects the first gas G1 into the first processing region 110. When the first gas G1 is exhausted from the first processing region 110 to the first exhaust member 63, the second purge gas PG2 may be exhausted from the second processing region 120 to the second exhaust member 64. Therefore, an unreacted first gas G1 and the second purge gas PG2 may be combined in the integration member 65, and thus, the substrate processing method according to the present inventive concept may decrease the amount of particles occurring in a process of exhausting a gas from each of the first processing region 110 and the second processing region 120, and moreover, may enhance stability.

Subsequently, when the second gas G2 is injected into the second processing region 120, the first purge gas PG1 may be injected into the first processing region 110. Such a step may be performed by injecting the first purge gas PG1 into the first processing region 110 by using the first injection unit 41 when the second injection unit 42 injects the second gas G2 into the second processing region 120. As the second gas G2 is injected into the second processing region 120, the deposition process may be performed on at least one substrate S disposed in the second processing region 120. The deposition process may be a process of depositing a thin film through a reaction between the first gas G1 and the second gas G2 adsorbed onto the substrate S. When the second gas G2 is exhausted from the second processing region 120 to the second exhaust member 64, the first purge gas PG1 may be exhausted from the first processing region 110 to the first exhaust member 63. Therefore, an unreacted second gas G2 and the first purge gas PG1 may be combined in the integration member 65, and thus, the substrate processing method according to the present inventive concept may decrease the amount of particles occurring in a process of exhausting a gas from each of the first processing region 110 and the second processing region 120, and moreover, may enhance stability.

Here, a step of injecting a gas into the first processing region may be implemented to sequentially perform a step of injecting a first gas into the first processing region and a step of injecting a first purge gas into the first processing region so as to purge the first gas.

Also, a step of injecting a gas into the second processing region may be implemented to sequentially perform a step of injecting the second purge gas into the second processing region when the first gas is injected into the first processing region and a step of injecting the second gas into the second processing region when the first purge gas is injected into the first processing region.

Therefore, the substrate processing method according to the present inventive concept may fundamentally prevent an unreacted first gas G1 and an unreacted second gas G2 from being combined in the integration member 65, in a process of exhausting a gas from each of the first processing region and the second processing region. Accordingly, the substrate processing method according to the present inventive concept may decrease the amount of particles occurring in a process of exhausting a gas from each of the first processing region and the second processing region, and moreover, may enhance stability.

Referring to FIGS. 1 to 6, the substrate processing method according to the present inventive concept may include a step of injecting a division gas into a region between the first processing region and the second processing region. Such a step may be performed by injecting the division gas into the third processing region 130 by using the third injection unit 43. Accordingly, the substrate processing method according to the present inventive concept may prevent a gas injected into the first processing region 110 from being combined with a gas injected into the second processing region 120.

Referring to FIGS. 1 to 6, the substrate processing method according to the present inventive concept may include a step of rotating the supporting unit. Such a step may be performed by rotating the supporting unit 3 so that at least one substrate S supported by the supporting unit 3 moves between the first processing region 110 and the second processing region 120.

The substrate processing method according to the present inventive concept may be implemented to perform a processing process in a state where at least one substrate S is disposed in only one region of the first processing region 110 and the second processing region 120. In this case, in a state where at least one substrate S1 is disposed in the first processing region 110, as illustrated in FIG. 5, a step of injecting the second purge gas into the second processing region may be performed when the first gas and the first purge gas are sequentially injected into the first processing region. Subsequently, at least one substrate S may move from the first processing region 110 to the second processing region 120 via the third processing region 130 through a step of rotating the supporting unit. In a state where at least one substrate S1 is disposed in the second processing region 120, a step of injecting the first purge gas into the first processing region may be performed when the second gas and the second purge gas are sequentially injected into the second processing region. By repeatedly performing such steps, the substrate processing method according to the present inventive concept may perform a processing process on at least one substrate S.

The substrate processing method according to the present inventive concept may be implemented to perform a processing process in a state where at least one substrate S is disposed in the first processing region 110 and at least one substrate S is disposed in the second processing region 120. In this case, in a state where at least one substrate S1 is disposed in each of the first processing region 110 and the second processing region 120, as illustrated in FIG. 6, a step of injecting the second purge gas into the second processing region may be performed when the first gas and the first purge gas are sequentially injected into the first processing region. Subsequently, a step of injecting the first purge gas into the first processing region may be performed when the second gas and the second purge gas are sequentially injected into the second processing region. Therefore, the adsorption process may be performed on the at least one substrate S disposed in the first processing region 110, and the deposition process may be performed on the at least one substrate S disposed in the second processing region 120. Subsequently, through a step of rotating the supporting unit, at least one substrate S may move from the first processing region 110 to the second processing region 120 via the third processing region 130 and at least one substrate S may move from the second processing region 120 to the first processing region 110 via the third processing region 130. By repeatedly performing such steps, the substrate processing method according to the present inventive concept may perform a processing process on a plurality of substrates S.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. A substrate processing method of performing a processing process on at least one substrate supported by a supporting unit in a processing space divided into a first processing region and a second processing region, the substrate processing method comprising:

a step of injecting a first gas into the first processing region and injecting a second purge gas into the second processing region simultaneously; and a step of injecting a first purge gas into the first processing region and injecting a second gas, reacting with the first gas, into the second processing region simultaneously, wherein, the steps are sequentially performed, when the first gas is injected into the first processing region, the first gas is exhausted from the first processing region and the second gas is not injected into the second processing region so the second gas is not exhausted from the second processing region, and when the second gas is injected into the second processing region, the second gas is exhausted from the second processing region and the first gas is not injected into the first processing region so the first gas is not exhausted from the first processing region.

2. The substrate processing method of claim 1, further comprising a step of injecting a division gas, which is for dividing the first processing region and the second processing region, into a region between the first processing region and the second processing region.

3. The substrate processing method of claim 1, further comprising a step of rotating the supporting unit so that the at least one substrate supported by the supporting unit moves between the first processing region and the second processing region.

4. The substrate processing method of claim 3, wherein the step of rotating the supporting unit is repeatedly performed.

5. The substrate processing method of claim 1, when the first gas is exhausted from the first processing region, the second gas is not exhausted from the second processing region, and when the second gas is exhausted from the second processing region, the first gas is not exhausted from the first processing region.

* * * * *